(12) United States Patent
Balkenende et al.

(10) Patent No.: US 7,768,081 B2
(45) Date of Patent: Aug. 3, 2010

(54) SEMICONDUCTOR DEVICE WITH TUNABLE ENERGY BAND GAP

(75) Inventors: Abraham Rudolf Balkenende, Eindhoven (NL); Erik Petrus Antonius Maria Bakkers, Eindhoven (NL); Louis Felix Feiner, Eindhoven (NL)

(73) Assignee: Koninklijke Philips Electronics N V, Eindhoven (NL)

( * ) Notice: Subject to any disclaimer, the term of this patent is extended or adjusted under 35 U.S.C. 154(b) by 447 days.

(21) Appl. No.: 11/577,807

(22) PCT Filed: Oct. 20, 2005

(86) PCT No.: PCT/IB2005/053442

§ 371 (c)(1), (2), (4) Date: Apr. 24, 2007

(87) PCT Pub. No.: WO2006/046177

PCT Pub. Date: May 4, 2006

(65) Prior Publication Data

US 2009/0121213 A1 May 14, 2009

(30) Foreign Application Priority Data

Oct. 27, 2004 (EP) ................................. 04105314

(51) Int. Cl.
*H01L 29/66* (2006.01)
(52) U.S. Cl. ................. 257/414; 257/13; 257/E27.006; 438/50
(58) Field of Classification Search ................. 257/414, 257/13; 438/50
See application file for complete search history.

(56) References Cited

U.S. PATENT DOCUMENTS

| 4,935,935 A | 6/1990 | Reed et al. |
| 2003/0168964 A1* | 9/2003 | Chen .......................... 313/495 |
| 2004/0012840 A1 | 1/2004 | Takiguchi et al. |
| 2004/0027646 A1 | 2/2004 | Miller et al. |
| 2004/0066677 A1 | 4/2004 | Zhang et al. |
| 2004/0120183 A1* | 6/2004 | Appenzeller et al. ........ 365/157 |
| 2004/0186220 A1 | 9/2004 | Smalley et al. |

FOREIGN PATENT DOCUMENTS

| EP | 1439546 A1 | 7/2004 |
| JP | 2004-193325 | * 7/2004 |
| JP | 2004193325 | 7/2004 |
| WO | 03083919 A2 | 10/2003 |

* cited by examiner

*Primary Examiner*—Davienne Monbleau
*Assistant Examiner*—Farid Khan

(57) ABSTRACT

A semiconductor device is provided in which energy band gap can be electrically varied. The device includes nanowires embedded in a material that exhibits a deformation when properly addressed, e.g., a piezoelectric material such as lead zirconate titanate (PZT), aluminum nitride (AlN) or zinc oxide (ZnO). The nanowires can be reversibly strained by applying a local deformation to the piezoelectric material by applying a voltage to the material. The resulting band gap variation can be utilized to tune the color of the light emitted from e.g., a LED or a laser. Further, contact resistance in semiconductor junctions can be controlled, e.g., for use in memories and switches.

15 Claims, 3 Drawing Sheets

SEMICONDUCTOR DEVICE WITH TUNABLE ENERGY BAND GAP

The present invention relates to a semiconductor device in which energy band gap can be electrically varied.

In a semiconducting material, band gap is an important parameter, which to a large extent determines properties of the semiconducting material. The band gap is defined as the difference in energy between the top of the valence band and the bottom of the conduction band. This is the energy that is required to excite an electron from the valence band into the conduction band. Electrons in the conduction band have the ability to move through the material, thereby enabling conduction of electricity. For light emitting diodes (LEDs), tuning of the band gap results in changes in color of emitted light. When an electron in the conduction band falls back into the valence band, the electron releases energy in the form of a photon of light. The larger the band gap, the more energetic the photon. A way to modify the band gap in a reversible manner is to strain the semiconductor lattice. It has been shown that band gap changes in the order of 100 meV may be accomplished. This change is sufficient for drastically changing the properties of e.g. a Schottky diode. In terms of light emission, this would result in a color change from e.g. yellow to green.

U.S. Pat. No. 4,935,935 discloses an electrically tunable semiconductor device. At least one film of piezoelectric substance is positioned in stress transmitting relation to the semiconductor device and a signal from an electrical circuit causes the piezoelectric film to transmit stress to the semiconductor thereby varying the response of the semiconductor device. When a tuning voltage is applied to the piezoelectric film, the film deforms in proportion to the tuning voltage and applies stress to the semiconductor, which stress varies the semiconductor energy gap.

A problem that remains in U.S. Pat. No. 4,935,935 is how to increase the effect of applied stress in an electrically tunable semiconductor device.

An object of the present invention is to solve the above given problems and to provide a semiconductor device in which energy band gap may be varied.

According to an aspect of the invention, the device comprises at least one semiconducting nanowire, a piezoelectric material, and an electrode arranged at the piezoelectric material, via which electrode a voltage may be applied to cause the piezoelectric material to deform, wherein the at least one semiconducting nanowire is arranged to be in mechanical contact with the piezoelectric material, and the deformation applies stress to the at least one semiconducting wire, which causes the energy band gap of the semiconducting nanowire to vary.

An idea of the present invention is to provide a device, which is based on nanowires embedded in a material that exhibits a deformation when properly addressed, e.g. a piezoelectric material such as lead zirconate titanate (PZT), aluminum nitride (AlN) or zinc oxide (ZnO). The device can, for example, be implemented in light emitting, switching and memory applications. The nanowires can be reversibly strained by applying a local deformation to the piezoelectric material by means of applying a voltage to the material. Hence, by means of an electrically induced mechanical stimulus, the nanowires is reversibly strained. The resulting band gap variation can be utilized to tune the color of the light emitted from e.g. a LED or a laser. This is a consequence of the fact that the band gap is proportional to the frequency of the emitted light. In other fields of application, contact resistance in semiconductor junctions can be controlled, and this feature is highly advantageous in memories and switches.

The present invention is advantageous, since for comparable strain conditions, i.e. for comparable voltages applied to the piezoelectric material, the stress experienced by the semiconducting wire (and therefore the width of the energy band gap of the wire) will increase with smaller wire diameters. This implies that the use of nanowires is highly advantageous in these types of applications. Further, if the diameter of the wires is sufficiently small for quantum confinement effects to be observable, which typically implies a diameter below 10-20 nm, the band gap will increase due to the quantum confinement. These two band gap-varying effects (i.e. band gap change induced by applied stress or by quantum confinement) enhance each other. For example, when compressive stress is applied, the band gap increases due to the applied stress, while in addition the band gap increases due to the increased quantum confinement effect because of the decrease of the diameter of the wire.

According to an embodiment of the present invention, the semiconducting nanowires are embedded in the piezoelectric material, which embedding further increases the stress caused by the piezoelectric material when a voltage is applied. Ideally, the nanowires are completely embedded in the material.

Further features of, and advantages with, the present invention will become apparent when studying the appended claims and the following description. Those skilled in the art realize that different features of the present invention can be combined to create embodiments other than those described in the following.

Preferred embodiments of the present invention will be described in more detail with reference made to the accompanying drawings, in which.

Semiconducting wires and carbon nanotubes can be grown by employing a well-known vapor-liquid-solid (VLS) process. This process is typically performed in a temperature range from 400 to 800° C. The VLS process uses small metal particles as a nucleus for further growth. When employing sufficiently small metal particles, wire diameter can be made smaller than 10 nm. As an alternative approach, semiconducting wires and metals can be deposited in a suitable template by employing an electrochemical process at room temperature. In either process, or by combining the two processes, segmented wires consisting of, for example, n and p type semiconductor material or exhibiting a heterojunction can be grown. When a high density of semiconducting wires is required, a suitable template can be used. Electrochemical oxidation, i.e. anodization, of aluminum is known to result in highly regular porous alumina when proper conditions prevail. Typically, the pores are perpendicular to the surface of a substrate on which they are arranged. The pore diameter is highly uniform and can generally be varied from about 5 nm up to 300 nm. By local surface pre-treatment, such as by employing e-beams or imprinting, the pores can be laterally ordered. Alternative templates, like track-etched membranes, can be used instead of anodized alumina. The present invention provides a method of fabrication based on catalytic growth from a suitable gas phase or electrochemical growth in a template, and embedding of nanowires in a piezoelectric material. For the nanowires, any semiconducting type IV, III-V or II-VI material can be used.

Figure 1:
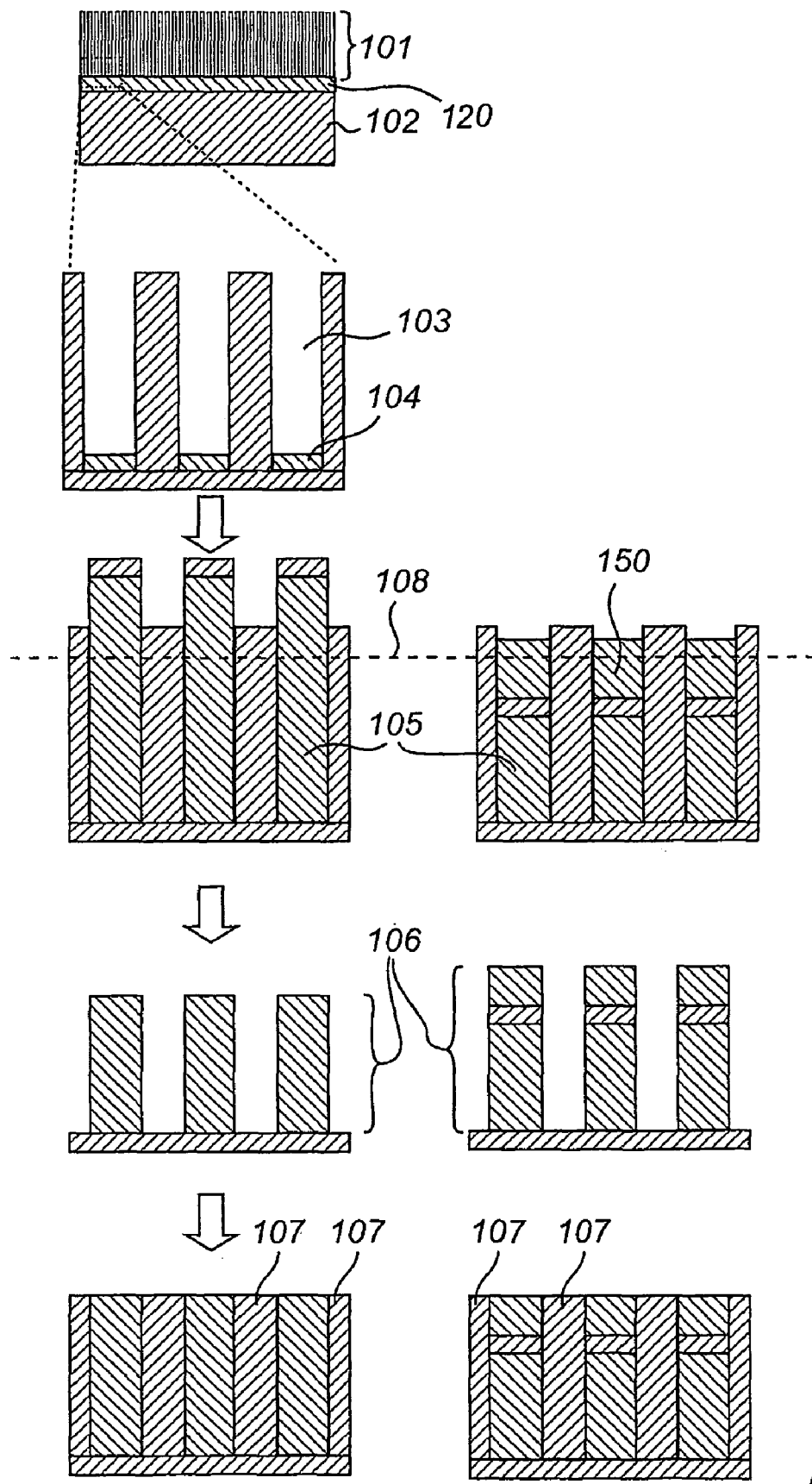
FIG. 1 shows an example of how nanowires can be grown, in which an anodized aluminum oxide template is arranged on a conductive layer of a substrate.

FIG. 1 shows an example of how nanowires can be grown. An anodized aluminum oxide template 101 is arranged on a conductive layer 120 of a substrate 102. The pores 103 of the template are partially filled with a metal deposition 104, such as Au, Fe, Co, Ni etc., as catalyst for VLS semiconductor wire growth. Standard VLS growth or electrochemical deposition may be employed to deposit a semiconducting material 105 such as CdSe, Si or InP. By changing the growth conditions during the wire growth, segmented wires 106 with e.g. pn-junctions or heterojunctions can be grown. Partially filled pores can further be filled (e.g. electrochemically) with a suitable contacting metal 150. Thereafter, the aluminium oxide (also known as alumina) is removed by etching the template in 1 M KOH, or by partly etching it in 4% $H_3PO_4$ or 1.5% $CrO_3$, such that at least the top section of the wires is no longer embedded in the alumina. Freestanding nanowires are hence created by means of the etching process. Subsequently, the top section is embedded in a piezoelectric material 107, e.g. $BaTiO_2$ or PZT, for example via a sol-gel synthesis. The layers created by the piezoelectric material may be patterned, such that individual wires or small groups of wires locally can be addressed. Before or after this embedding process, the top section of the layers are polished, which is indicated by means of the dotted line 108, and electrical contacts (not shown) are deposited thereon. At least the top metal should be patterned such that wires and piezoelectric material can be addressed separately. The nanowires may in an embodiment of the invention be partially or completely covered by a thin layer of dielectric. If the piezoelectric material (or at least the contact to the piezoelectric material) is not patterned, all wires are affected simultaneously. This is acceptable in the case of LED-type light emitters, but for some electronic applications, it should be possible to locally change the properties of the semiconducting wires, while not affecting others.

When an Au pattern is directly deposited on Si (e.g. by patterning of a thin Au film using lithographic methods or by employing self-assembly methods to deposit colloidal Au particles), the VLS method can be used to locally grow wires at the position of the Au particles. Epitaxial growth of GaP, GaAs and InP on Si(100) and Si(111) has previously been described, while GaN epitaxially has been grown on various sapphire surfaces (e.g. $Al_2O_3$(001), $Al_2O_3$(2-10), $Al_2O_3$(100), $Al_2O_3$(101)). An epitaxial relation between the wire and the substrate is favorable with respect to wire orientation and (bottom) contact of the wire. This method results in freestanding wires at the substrate surface and further processing can be performed as described in other embodiments.

Figure 2:
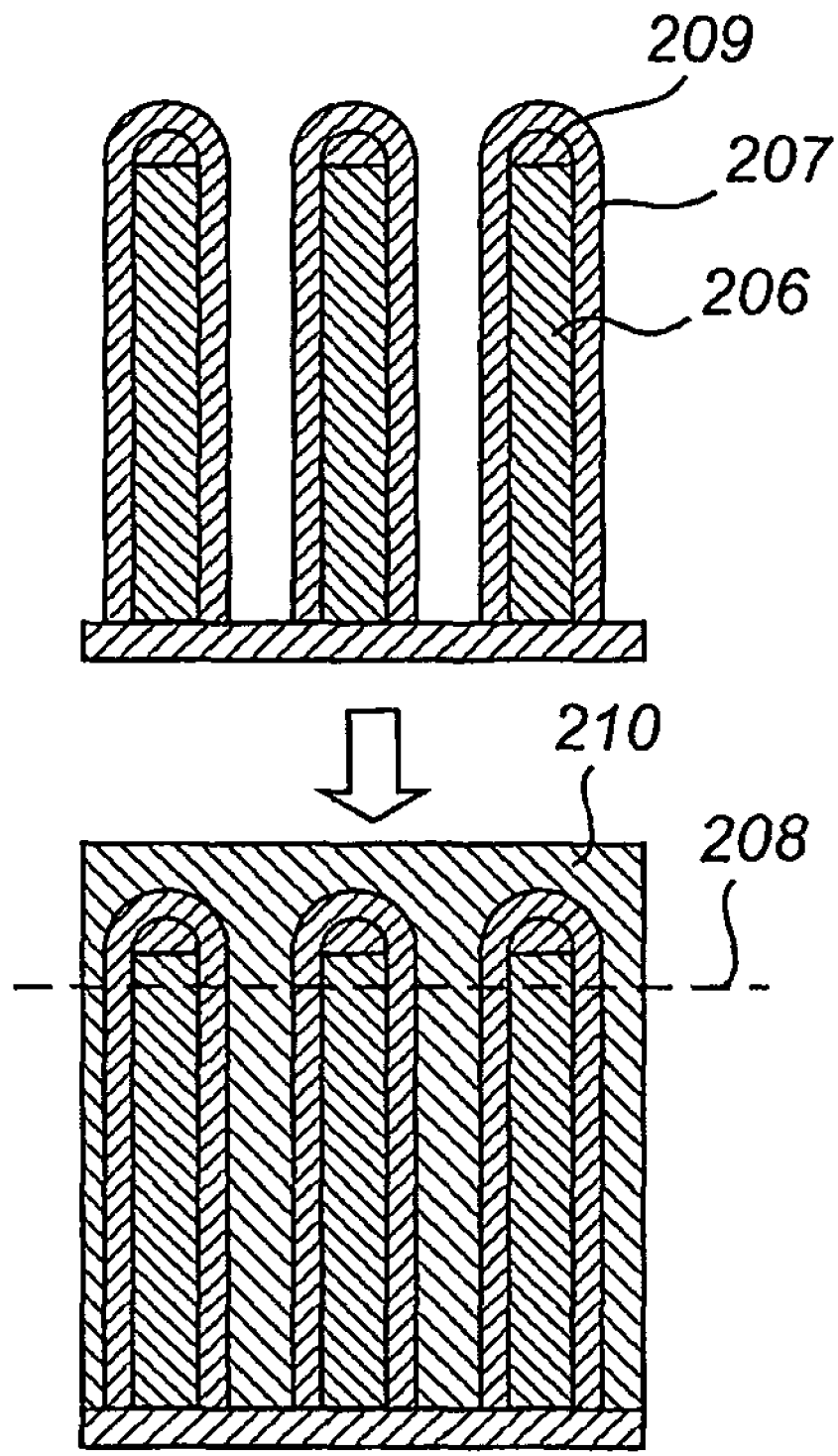
FIG. 2 shows an embodiment of the present invention, in which piezoelectric material is deposited as a thin layer around the nanowires.

FIG. 2 shows an embodiment of the present invention, in which piezoelectric material 207 is deposited as a thin layer around the nanowires 206. The nanowires are grown as described in connection to FIG. 1. In this particular embodiment, the nanowires are topped with metal 209. The wires are covered by a layer of piezoelectric material with good step coverage, e.g. by means of chemical vapor deposition or sputter deposition in combination with sputter etching. The area between the wires is subsequently filled with a dielectric material 210. The top section of the layers are polished, which is indicated by means of the dotted line 208, and electrical contacts (not shown) are deposited thereon.

Figure 3:
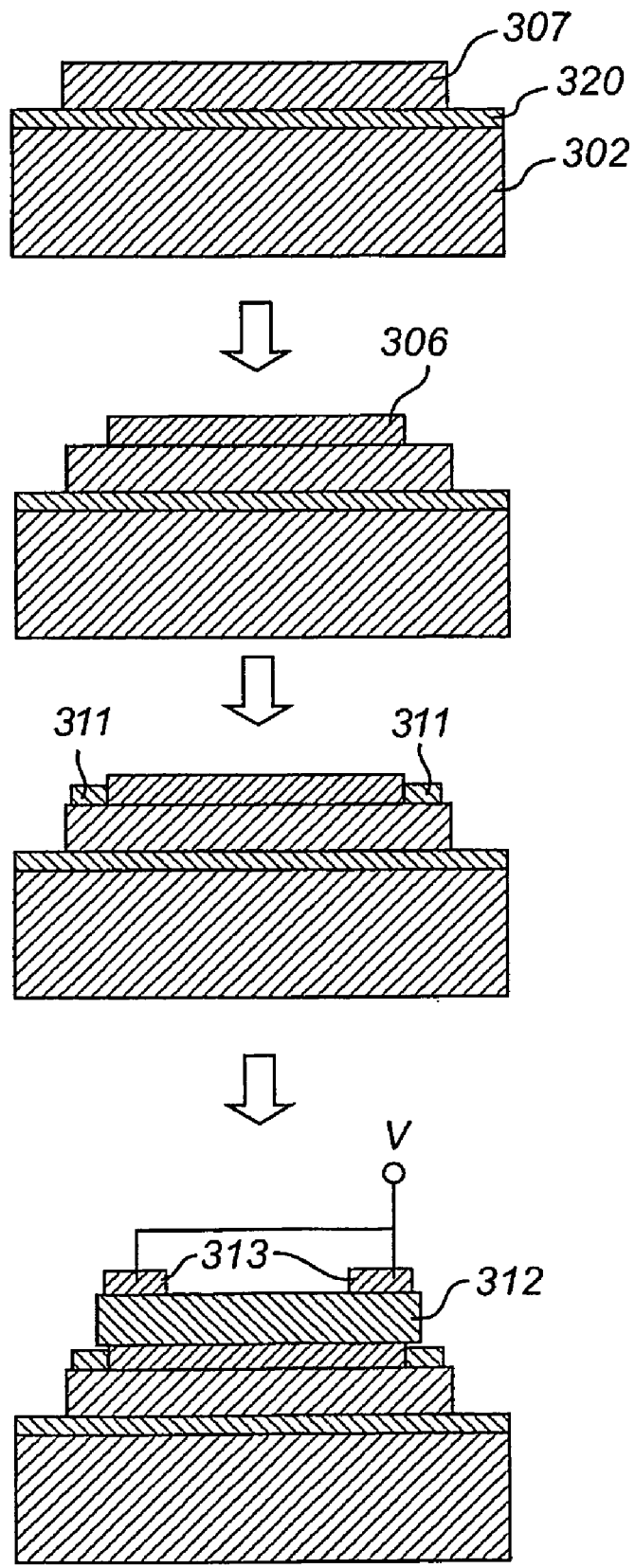
FIG. 3 shows another embodiment of the present invention, in which nanowires and a piezoelectric material is arranged on a conductive layer of a substrate.

FIG. 3 shows another embodiment of the present invention, in which a piezoelectric material 307 is arranged on a conductive layer 320 of a substrate 302. Thereafter, a nanowire 306 is deposited thereupon, and electrical contacts in the form of metal source and drain electrodes 311 are applied to the nanowire 306. Subsequently, another layer of piezoelectric material 312 may be deposited on the nanowire 306, such that the nanowire becomes embedded in the piezoelectric material 307, 312. Top electrodes 313 are then applied locally to address the piezoelectric material. In case the top layer of piezoelectric material 312 is not used, the top electrodes are applied to the piezoelectric material 307. As a result of the second layer 312, the nanowire can be actuated "all-around", which increases the effect of the applied stress. When a voltage V is applied to the piezoelectric material 312 via the electrodes 313, the piezoelectric material undergoes a local expansion, and the nanowire 306 is reversibly exposed to stress. The resulting band gap variation of the nanowire 306 causes electrical properties of the nanowire to be varied.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. A semiconductor device in which energy band gap can be electrically varied, the device comprising:
   at least one semiconducting nanowire;
   a piezoelectric material;
   an electrode arranged at the piezoelectric material, via which electrode a voltage may be applied to cause the piezoelectric material to deform; wherein
   two different surfaces of said at least one semiconducting nanowire are in mechanical contact with said piezoelectric material, and said deformation applies stress to said at least one semiconducting nanowire, which causes the energy band gap of the semiconducting nanowire to vary, wherein said at least one semiconducting nanowire is embedded in the piezoelectric material between two surfaces of the piezoelectric material.

2. The semiconductor device in accordance with claim 1, wherein the device comprises a number of semiconducting nanowires being segmented.

3. The semiconductor device in accordance with claim 1, wherein a layer of dielectric is applied to said at least one semiconducting nanowire.

4. The semiconductor device in accordance with claim 1, wherein electrical contacts are arranged at said at least one semiconducting nanowire.

5. The semiconductor device in accordance with claim 1, wherein said device comprises a number of semiconducting nanowires that are arranged in juxtaposition and an area between the semiconducting nanowires is filled with a dielectric material.

6. The semiconductor device in accordance with claim 1, further comprising a substrate having a conductive layer on which said piezoelectric material is arranged.

7. The semiconductor device in accordance with claim 1, wherein said at least one semiconducting nanowire is comprised in a light emitting diode, such that the varying energy band gap of the semiconducting nanowire varies the color of light emitted from said light emitting diode.

8. The semiconductor device of claim 1, wherein the two different surfaces are on opposing sides of the at least one semiconducting nanowire.

9. A semiconductor device comprising:
   a nanowire;
   a piezoelectric material, wherein the nanowire directly contacts the piezoelectric material; and an electrode arranged at the piezoelectric material for applying a voltage to change an energy band gap of the nanowire by deforming the piezoelectric material to stress the nanowire.

10. The semiconductor device of claim 9, wherein the nanowire directly contacts two different surfaces of the piezoelectric material.

11. The semiconductor device of claim 10, wherein the two different surfaces are on opposing sides of the nanowire.

12. The semiconductor device of claim 9, wherein the nanowire comprises a semiconductor.

13. A semiconductor device comprising:
a first piezoelectric layer;
a second piezoelectric layer;
a nanowire located between the first piezoelectric layer and the second piezoelectric layer; and
an electrode structure configured for applying a voltage to at least one piezoelectric layer of the first piezoelectric layer and the second piezoelectric layer for changing an energy band gap of the nanowire by deforming the at least one piezoelectric layer to stress the nanowire.

14. The semiconductor device of claim 13, wherein the nanowire directly contacts the at least one piezoelectric layer.

15. The semiconductor device of claim 13, wherein the nanowire directly contacts the first piezoelectric layer and the second piezoelectric layer.

* * * * *